US007147739B2

(12) United States Patent  
Hiller et al.

(10) Patent No.: US 7,147,739 B2  
(45) Date of Patent: Dec. 12, 2006

(54) SYSTEMS FOR ASSEMBLING COMPONENTS ON SUBMOUNTS AND METHODS THEREFOR

(75) Inventors: Norbert Hiller, Chapel Hill, NC (US); Peter S. Andrews, Durham, NC (US); David B. Slater, Jr., Raleigh, NC (US); Gerald H. Negley, Hillsborough, NC (US)

(73) Assignee: Cree Inc., Durham, NC (US)

( * ) Notice: Subject to any disclaimer, the term of this patent is extended or adjusted under 35 U.S.C. 154(b) by 475 days.

(21) Appl. No.: 10/325,616

(22) Filed: Dec. 20, 2002

(65) Prior Publication Data

US 2004/0118512 A1    Jun. 24, 2004

(51) Int. Cl.
*B32B 37/00* (2006.01)
*H05K 13/00* (2006.01)
*H01L 21/00* (2006.01)

(52) U.S. Cl. ............... 156/230; 156/238; 156/241; 156/543; 156/556; 29/729; 29/739; 29/740; 438/464

(58) Field of Classification Search ............ 156/230, 156/238, 241, 297, 299, 302, 324, 540, 541, 156/543, 552, 556; 29/832, 739, 740, 741; 438/464
See application file for complete search history.

(56) References Cited

U.S. PATENT DOCUMENTS

| 3,724,068 | A | * | 4/1973 | Galli ........................... 29/833 |
| 4,653,664 | A |   | 3/1987 | Hineno et al. ................. 221/3 |
| 4,915,565 | A |   | 4/1990 | Bond et al. ................. 414/225 |
| 5,809,639 | A |   | 9/1998 | Alvite ......................... 29/740 |
| 6,753,614 | B1 | * | 6/2004 | Yamazaki et al. ........... 257/782 |

FOREIGN PATENT DOCUMENTS

| EP | 0 542 093 A1 | 11/1992 |
| EP | 0 949 858 A1 | 10/1999 |

OTHER PUBLICATIONS

Copy of International Search Report for PCT/US/38449 (mailing date Apr. 19, 2004).

* cited by examiner

*Primary Examiner*—Justin Fischer
(74) *Attorney, Agent, or Firm*—Myers Bigel Sibley & Sajovec, PA

(57) ABSTRACT

A component assembly system is provided that includes a longitudinally elongated tape carrier, a longitudinally elongated submount carrier, and an assembly machine. A plurality of components may be attached to the tape carrier. The assembly machine is adapted to receiving the tape carrier, with the components attached thereto, and to receive the submount carrier. The assembly machine is further adapted to bring the tape carrier in close proximity to the submount carrier, and to attach the components to the submounts on the submount carrier.

15 Claims, 4 Drawing Sheets

SYSTEMS FOR ASSEMBLING COMPONENTS ON SUBMOUNTS AND METHODS THEREFOR

FIELD OF THE INVENTION

This invention relates to component assembly systems and methods therefor.

BACKGROUND OF THE INVENTION

Light emitting diodes (LEDs) are widely used in consumer and commercial applications. As is well known to those having skill in the art, a light emitting diode generally includes a diode region on a microelectronic substrate. A plurality of closely spaced LEDs may be manufactured on a microelectronic substrate wafer. The wafer may comprise, for example, gallium arsenide, gallium phosphide, alloys thereof, silicon carbide and/or sapphire. The wafer may be diced to separate the individual LED, or groups of LEDs, as discrete die. The discrete LED die may be passed to an automated assembly device. The assembly device may separately attach the LED die to submounts and may connect electrical leads. The mounted LED die may then be encapsulated in one or more protective layers.

The increasing use of LEDs in commercial applications, along with the need for decreased cost, has highlighted the importance of systems that may assemble discrete LED die into packaged products in an efficient and expeditious manner.

SUMMARY OF THE INVENTION

According to some embodiments of the present invention, a component assembly system includes a component carrier, submounts, and a pick and place machine. The component carrier includes a plurality of attached components. The pick and place machine is adapted to simultaneously pick up more than one of the plurality of components from the component carrier, and to simultaneously place the picked up components on the submounts.

In some embodiments, the component carrier may be a longitudinally elongated tape carrier. The components may be placed on the tape carrier to form a pattern of at least two longitudinal columns. The distance between the picked up components may be the same as the distance between portions of the submounts on which the pick and place machine places the components. The pick and place machine may maintain a constant distance between the components from when they are picked up to when they are placed on the submounts. The pick and place machine may be adapted to attach the components to the submounts by placing an adhesive material, or melted solder, between the components and the submounts, and/or by forming a thermocompression bond therebetween.

According to other embodiments of the present invention, a component assembly system includes a longitudinally elongated tape carrier, a longitudinally elongated submount carrier, and an assembly machine. A plurality of components may be attached to the tape carrier. The assembly machine is adapted to receive the tape carrier, with the components attached thereto, and to receive the submount carrier. The assembly machine is further adapted to bring the tape carrier in close proximity to the submount carrier, and to attach the components to the submounts on the submount carrier.

In further embodiments, the assembly machine may be adapted to detach the tape carrier from the components after the components are attached to the submounts on the submount carrier.

According to other embodiments of the present invention, a component assembly system includes a plurality of components, a longitudinally elongated submount carrier, and a pick and place machine. The submount carrier includes a plurality of connected submounts. The pick and place machine is adapted to pick up one or more of the components, and to place the picked up components on the connected submounts of the longitudinally elongated submount carrier.

DETAILED DESCRIPTION OF PREFERRED EMBODIMENTS

Figure 1:
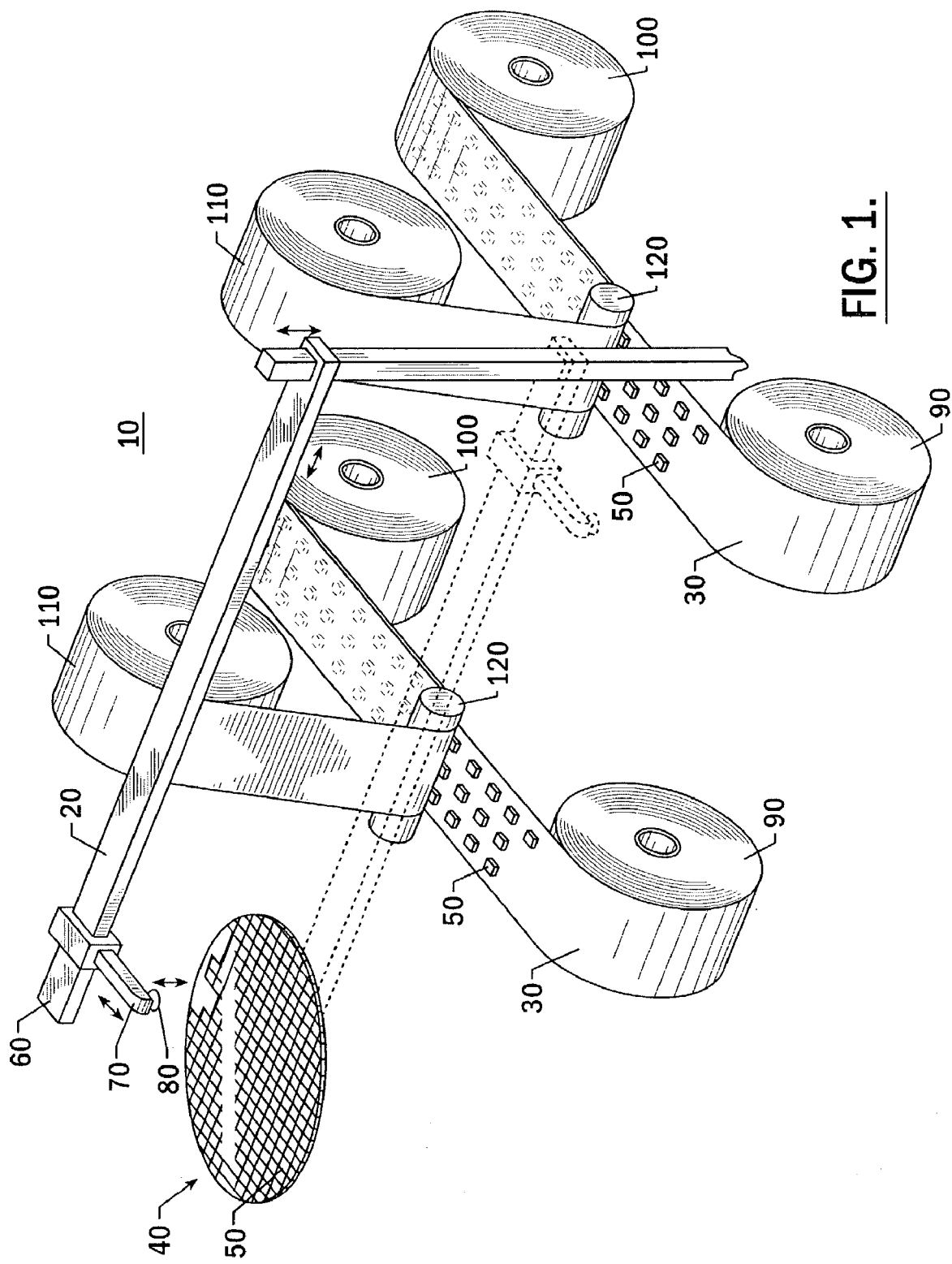
FIG. 1 is a perspective view of systems and methods for placing die on a continuous tape carrier according to embodiments of the present invention.

The present invention now will be described more fully hereinafter with reference to the accompanying drawings, in which embodiments of the invention are shown. This invention should not be construed as limited to the embodiments set forth herein. Rather, these embodiments are provided so that this disclosure will be thorough and complete, and will fully convey the scope of the invention to those skilled in the art. In the drawings, the size of elements are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Embodiments of the present invention now will be described with reference to apparatus and operations for manufacturing light emitting diode (LEDs) components in submount assemblies. However, it will be understood by those having skill in the art that embodiments of the present invention may be used to manufacture component assemblies using any small discrete electrical and/or mechanical components, including but limited to, LED, groups of LED die, laser diodes, surface mount components, through hole components, flip chip devices, and connectors, in lieu of the illustrated LEDs. Moreover, it will be understood by those having skill in the art that embodiments of the present invention may be used with any sub-assembly structure, or completed assembly structure, in lieu of the illustrated submounts.

Referring to FIG. 1, a tape carrier assembly system 10 is shown in accordance with embodiments of the present invention. The assembly system 10 includes a pick and place machine 20 that may be used to pick up components and to attach the components to one of two continuous tape carriers 30. The continuous tape carrier 30 may later be used to feed the components thereon to other manufacturing processes. In some embodiments, the assembly system 10 may be used with a wafer 40 on which a plurality of LED die 50 components have been formed. Discrete LED die 50 have been formed on the wafer 40 and separated by dicing (e.g., sawing and/or scoring and breaking) the LED die 50 along their periphery. One side of the wafer 40 may be attached to an adhesive sheet before dicing so that the diced LED die 50 retain their relative positions. The term "LED die" may refer to a discrete die having one or more LED devices thereon. The process of dicing a wafer is well known to those having skill in the art and need not be described further herein.

The pick and place machine 20 may sort the LED die 50 between the two continuous tape carriers 30. For example, the LED die 50 may be sorted based upon the brightness, wavelength, and/or another feature of each placed LED die 50. As will be understood by one having skill in the art in light of the present description, more than two continuous tape carriers 30 may be used with the present invention to enable further sorting of the LED die 50 and/or to provide other improvements in the manufacturing process.

The pick and place machine 20 may include a frame 60, a pick up head 70 that may be moved, under microprocessor control, in three dimensions along the frame, and a vacuum spindle 80. The vacuum spindle 80 may be connected to a distal end of the pick up head 70 that is away from the frame 60. To pick up a LED die 50, the vacuum spindle 80 may be positioned over a selected LED die 50, and may be lowered to make contact. The vacuum spindle 80 may be adapted to make a sealing contact with the LED die 50 and to lift it up and carry it over to the tape carrier 30. Alternatively, mechanical grippers may be used to acquire the LED die 50 in addition to, or in place of, the vacuum spindle 80.

The tape carrier system 10 may further include a tape drive for progressively advancing the tape carrier 30 along a tape path that may include a placement zone where the vacuum spindle 80 may be positioned and lowered to place the LED die 50 on the tape carrier 30. The tape carrier 30 may include a pressure sensitive adhesive layer that may attach to LED die 50 that are placed thereon.

The pick and place machine 20 may attach a plurality of the LED die 50 to the tape carrier 30 to form a pattern of lateral rows and longitudinal columns of the LED die 50. In one embodiment, the spacing between the rows and/or columns of LED die 50 may be set so as to facilitate their use in subsequent manufacturing processes, as will be discussed further below. In other embodiments, the LED die 50 may not form a pattern of rows and/or columns, and the spacing therebetween may not be uniform.

After each row of LED die 50 is attached to the tape carrier 30, the tape may be further unwound from a tape reel 90, advanced along the tape path, and wound onto a take up reel 100. A protective cover 110 maybe provided to cover the adhesive surface of the tape carrier 30 and the LED die 50. The protective cover 110 may serve to avoid the tape carrier 30 from attaching to itself when is it wound on the tape up reel 100 and/or to more securely retain the LED die 50 on the tape carrier 30. A roller 120 may be provided to press the protective cover 110 on the tape carrier 30, after the LED die 50 are attached and before the tape carrier 30 is wound onto the tape up reel 100.

Figure 2:
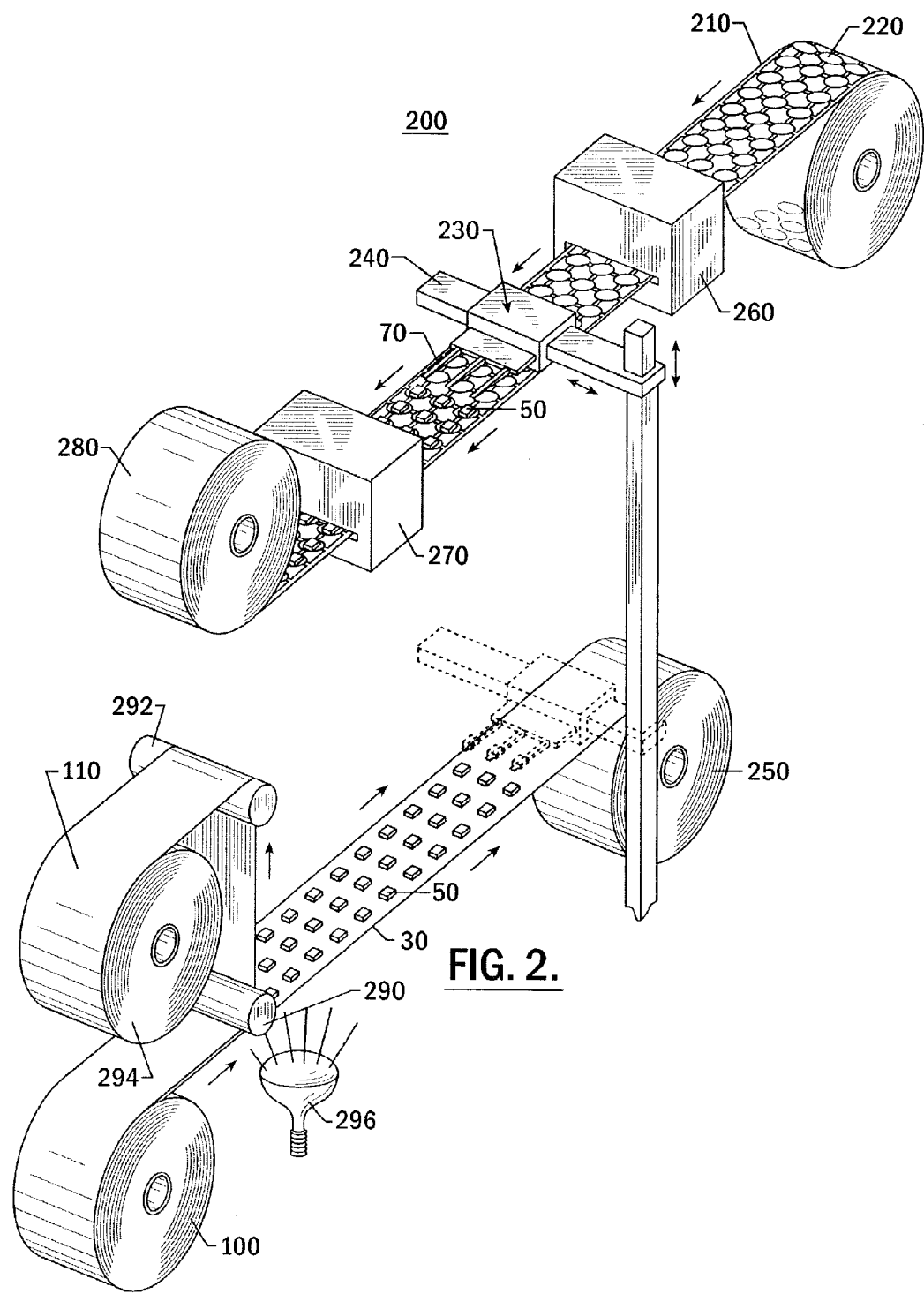
FIG. 2 is a perspective view of systems and methods for picking and placing a plurality of die from a continuous tape carrier to a continuous submount carrier according to embodiments of the present invention.

In FIG. 2, a component assembly system 200 is provided according to embodiments of the present invention. The component assembly system 200 may receive the tape carrier 30 and a continuous submount carrier 210. In some embodiments, the submount carrier 210 may include a plurality of submounts 220 that may be connected to form a longitudially elongated flexible carrier. The submounts 220 may each include a component receiving portion that may be adapted to receive one or more of the LED die 50. The assembly system 200 may include a pick and place machine 230 that may simultaneously move a plurality of LED die 50 from the tape carrier 30 to a plurality of the submounts 220. The pick and place machine 230 may include a frame 240 and a plurality of pick up heads 70 that may be moved in three dimensions along the frame. Each of the pick up heads 70 may include the vacuum spindle 80, as described in FIG. 1, and/or a mechanical gripper, to lift and carry the LED die 50.

Three pick up heads 70 are shown in FIG. 2 for illustration purposes only. According to embodiments of the present invention, any practical number of pick up heads 70 may be used to enable the simultaneous pick up, and subsequent placement, of a plurality of LED die 50. Increasing the number of the pick up heads 70 may increase the rate at which the LED die 50 may be assembled on the submounts 220. In some embodiments, the lateral spacing between the pick up heads 70, the LED die 50 on the tape carrier 30, and the component receiving portion of the submounts 220 are about equal, which may allow faster pick up and placement of the LED die 50 and/or reduce the complexity of the pick and place machine 230. In other embodiments, the tape carrier assembly system 10, shown in FIG. 1, places the LED die 50 on the tape carrier 30 with the same lateral, and/or longitudinal, spacing as the component receiving portion of the submounts 220.

The component assembly system 200 may progressively advance the tape carrier 30 along a tape path that includes a removal zone where the pick up heads 70 may be positioned over one or more rows of the LED die 50, and lowered to simultaneously pick up, and detach, the LED die 50 from the tape carrier 30. As each row of LED die 50 are detached, the tape carrier 30 may be advanced along the tape path to place another row of LED die 50 within the removal zone. The tape carrier 30 may then be wound onto a blank tape reel 250. In other embodiments, the pick up heads 70 may be arranged to simultaneously pick up a plurality of LED die 50 along a column. In still further embodiments, the pick up heads 70 may be arranged to simultaneously pick up a plurality of LED die 50 across a row and along a column (e.g., Row×Column of 2×2, 2×3, 3×3, . . . ).

Prior to the tape carrier 30 passing through the removal zone, the protective cover 110 may be removed. In some embodiments, the protective cover 110 may be progressively advanced along a path that passes under a roller 290, and then may sharply change direction to move away from the tape carrier 30 with sufficient force to detach the protective cover 110 from the tape carrier 30. The protective cover 100 may then roll across a guide roller 292 and onto a take up reel 294. In further embodiments, the adhesive force between the protective cover 100 and the tape carrier 30 may be reduced before separation, by exposing one or both of them to ultra-violet light and/or heat, from a source 296.

The component assembly system 200 may further include a submount preparation apparatus 260 and a bonding apparatus 270. The component assembly system 200 may progressively advance the submount carriers 210 along a submount path that passes through the submount preparation apparatus 260, to a placement zone where the LED die 50 may be placed on the component receiving portion of the submounts 220, through the bonding apparatus 270, and may then be wound onto a carrier reel 280. The submount preparation apparatus 260 may prepare the component receiving portion of the submounts 220 for attaching to the LED die 50. In one embodiment, the submount preparation apparatus 260 applies an adhesive material (e.g., epoxy or glue) to form a layer between the component receiving portion of the submounts 220 and the LED die 50.

The submount carriers 210 may then be advanced to the placement zone where the pick up heads 70, with the attached LED die 50, may be simultaneously positioned over the component receiving portion of the submounts 220, and lowered to contact and release the LED die 50 thereon. The submounts 220, with the LED die 50, may be further advanced to the bonding apparatus 270, where heat may be applied to at least partially cure the adhesive material and more securely attach the LED die 50 to the submounts 220.

Apparatus may also be provided that receive the carrier reel 280, connect electrical leads to the LED die 50, separate the submounts 220 from the submount carrier 210, and encapsulated the submounts 220 in protective packaging (e.g., a light transmissive plastic or glass material) to form discrete LED devices.

Although the submount preparation apparatus 260 and bonding apparatus 270 are illustrated as separate apparatus, according to some embodiments of the present invention, they may be combined into one or more apparatus that provide the described functions. In other embodiments, the submount preparation apparatus 260 may form a solder material between the component receiving portion of the submounts 220 and the LED die 50, instead of applying an adhesive material. The bonding apparatus 270 may apply heat to at least partially melt the solder material and to more securely attach the LED die 50 to the component receiving portion of the submounts 220. In other embodiments, the submount preparation apparatus 260 provides a sufficient adhesion between the LED die 50 and the submounts 220 such that the bonding apparatus 270 is not used.

In still other embodiments, the LED die 50 may be attached to the component receiving portion of the submounts 220 by thermocompression bonding. A bonding material may be provided between the LED die 50 and the component receiving portion of the submounts 220. The pick up heads 70, or other apparatus, may place the LED die 50 in mechanical contact with the component receiving portion of the submounts 220, and may subject the bonding material to mechanical and/or sonic stimulation at a temperature that is greater than its eutectic temperature. The bonding material may form an adhesive bond with the LED die 50 and the submounts 220. In some embodiments, the thermocompression bonding may be performed without the submount preparation apparatus 260 and/or the bonding apparatus 270.

Figure 3:
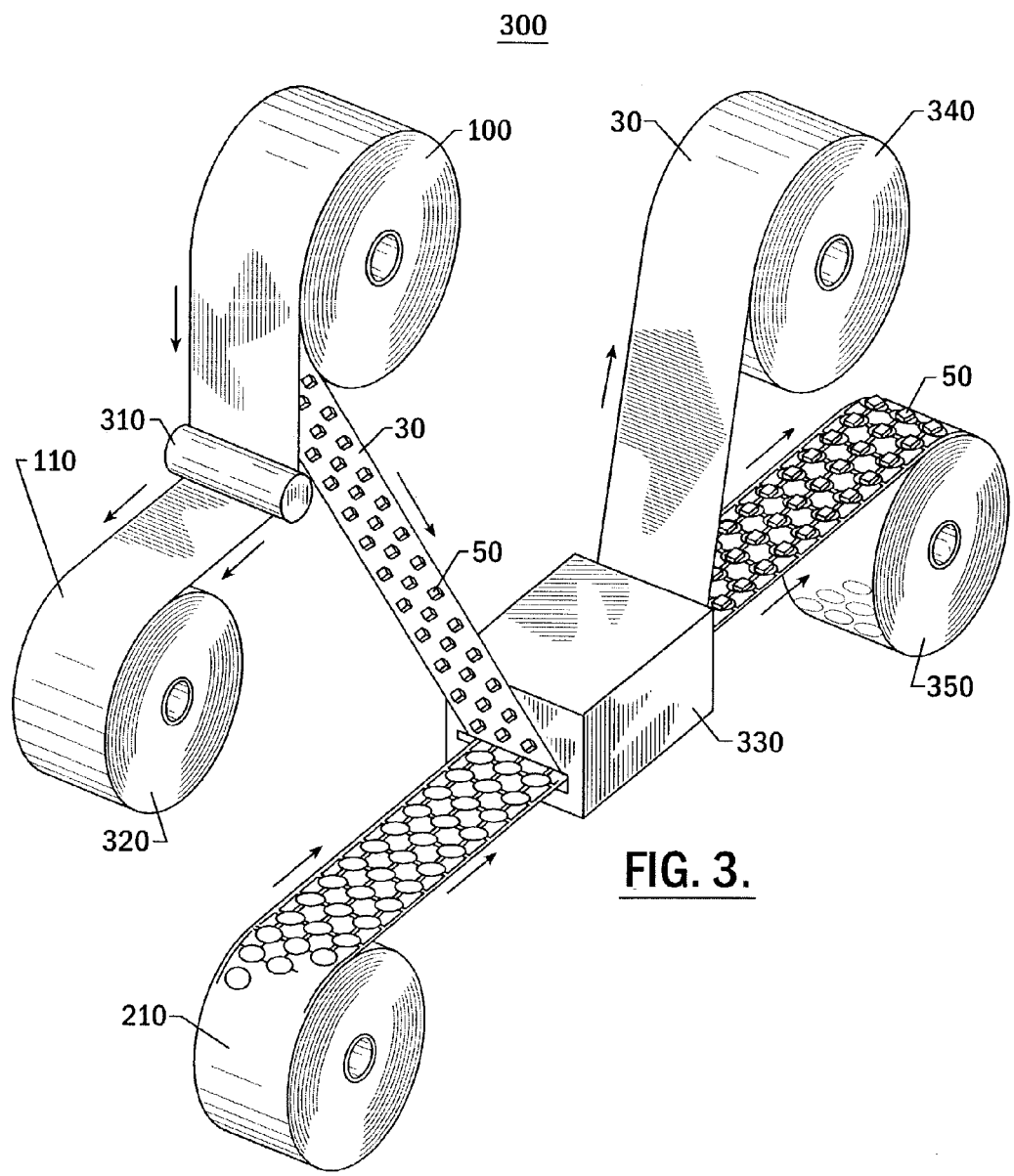
FIG. 3 is a perspective view of systems and methods for assembling die from a continuous tape carrier on a continuous submount carrier according to embodiments of the present invention.

In FIG. 3, a component assembly system 300 is provided according to other embodiments of the present invention. The component assembly system 300 may receive the tape reel 100, with the tape carrier 30, the attached LED die 50, and the protective cover 110, and may receive the continuous submount carrier 210. The protective cover 110 may be separated from the tape carrier 30, and may be passed under a roller 310 and taken up on a reel 320. The component assembly system 300 may advance the tape carrier 30 and the submount carrier 210 at the same rate along paths that become closely spaced within a bonding apparatus 330. The LED die 50 may be aligned with the component receiving portion of the submounts 220, and the bonding apparatus 330 may simultaneously attach one or more rows of the LED die 50 to one or more rows of the component receiving portions of the submounts 220. In some embodiments, the bonding apparatus 330 prepares the component receiving portion of the submounts 220 for attaching to the LED die 50. In some embodiments, the bonding apparatus 330 may form an adhesive material (e.g., epoxy or glue) between the component receiving portion of the submounts 220 and the LED die 50. Heat may be applied to sufficiently cure the adhesive material so that the LED die 50 are attached more strongly to the submounts 220 than to the tape carrier 30. The tape carrier 30 may be separated from the LED die 50 and wound onto a reel 340. The submount carrier 210, with the attached LED die 50, may be wound onto a carrier reel 350.

In other embodiments, the bonding apparatus 330 may apply a solder material as a layer between the component receiving portion of the submounts 220 and the LED die 50, instead of applying an adhesive material. Heat may be applied to at least partially melt the solder material and to more securely attach the LED die 50 to the submounts 220.

In still other embodiments, the LED die 50 may be attached to the component receiving portion of the submounts 220 by thermocompression bonding. A bonding material may be provided between the LED die 50 and the component receiving portion of the submounts 220. The bonding apparatus 330 may place the LED die 50 in mechanical contact with the component receiving portion of the submounts 220, and subject the bonding material to mechanical and/or sonic stimulation at a temperature that is greater than its eutectic temperature. The bonding material may form a bond with the LED die 50 and the submounts 220.

Figure 4:
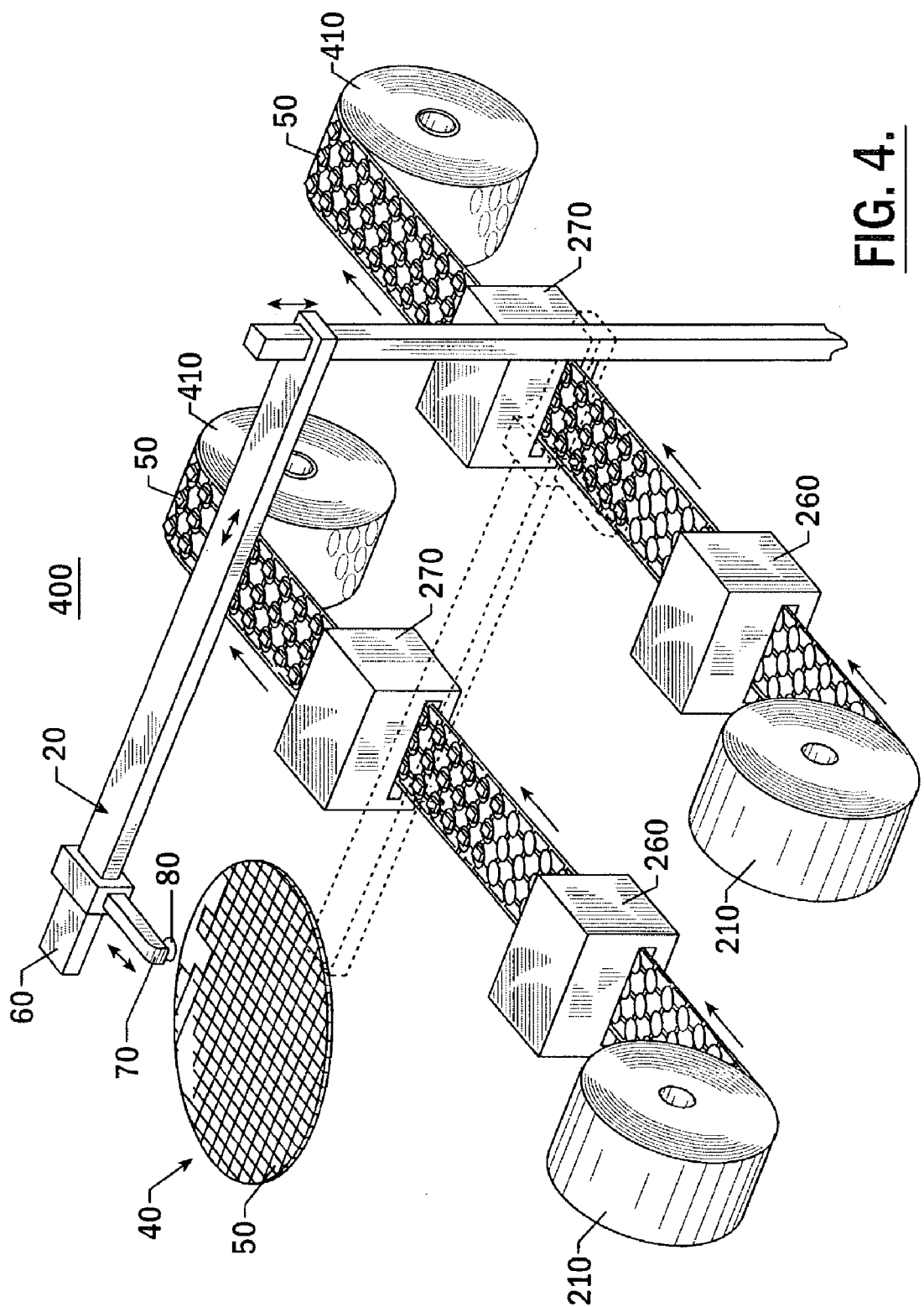
FIG. 4 is a perspective view of systems and methods for placing die on submounts that are provided on a continuous submount carrier according to embodiments of the present invention.

In FIG. 4, a component assembly system 400 is provided according to other embodiments of the present invention. The component assembly system 400 may include the pick and place machine 20 and may be adapted to receive the wafer 40 with the plurality of LED die 50 and one, two, or more of the continuous submount carrier 210. The component assembly system 400 may be used to move the LED die 50 from the wafer 40 to the component receiving portion of the submounts 220. The component assembly system 400 may further include the submount preparation apparatus 260 and the bonding apparatus 270. The component assembly system 400 may progressively advance the submount carrier 210 along a carrier path through the submount preparation apparatus 260, through a placement zone where the LED die 50 may be placed on the component receiving portion of the submounts 220, and through the bonding apparatus 270. In some embodiments, the operation of the pick and place machine 20, the submount preparation apparatus 260, and the bonding apparatus 270 may operate substantially the same as that described with reference to FIG. 2. The submount preparation apparatus 260 prepares the component receiving portion of the submounts 220 for attaching to the LED die 50. After the die are placed on the component receiving portion of the submounts 220, the submount carrier 210 is advanced through the bonding apparatus 270 where the LED die 50 are more securely attached to the submounts 220. The submount carrier 210, with the attached LED die 50, may be wound onto a carrier reel 410.

The pick and place machine 20 may sort the LED die 50 between the two illustrated submount carriers 210. For example, the LED die 50 may be sorted based upon the brightness, wavelength, and/or another feature of each placed LED die 50. As will be understood by one having skill in the art in light of the present description, more than two submount carriers 210 may be used with the present invention to enable further sorting of the LED die 50 and/or to provide other improvements in the manufacturing process.

While the present invention has been described with reference to the particular systems illustrated in FIGS. 1 through 4, as will be appreciated by those of skill in the art in light of the present disclosure, various modifications may be made to such systems while still benefiting from the teachings of the present invention. For example, while the tape carrier and submount carrier have been illustrated and described as flexible tape that may be wound onto reels, according to some embodiments of the present invention, one or both of them may be formed in other shapes, including, but not limited to, rectangular, triangular, oval or circular sheets. According to other embodiments of the present invention, the tape carrier and/or the submount carrier may include a plurality of cavities, where each cavity is adapted to receive a LED die or other component. Additionally, although the LED die are illustrated as squares, other shapes may be used with embodiments of the present invention, including, but not limited to, rectangular, triangular, oval or circular. Accordingly, the present invention should not be construed as limited to the particular structures or devices described above.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A component assembly system, comprising:
   a longitudinally elongated tape carrier;
   a plurality of components attached to the tape carrier;
   a longitudinally elongated submount carrier, the submount carrier including a plurality of connected submounts; and
   an assembly machine that is adapted to receive the tape carrier, with the components attached thereto, and to receive the submount carrier, and is adapted to bring the tape carrier in close proximity to the submount carrier, and to attach the components to the connected submounts on the submount carrier.

2. The component assembly system of claim 1, wherein the assembly machine is further adapted to detach the tape carrier from the components after the components are attached to the submounts on the submount carrier.

3. The component assembly system of claim 1, wherein each of the submount carriers includes a component receiving portion that is adapted to receive at least one of the components, and the distance between the component receiving portions of at least two adjacent submounts is the same as the distance between at least two adjacent components on the tape carrier.

4. The component assembly system of claim 3, wherein the component receiving portions of adjacent submounts are separated by the same distance as adjacent components on the tape carrier.

5. The component assembly system of claim 1, wherein the components are attached to the tape carrier to form a pattern of at least two longitudinal columns of components.

6. The component assembly system of claim 1, wherein the tape carrier includes an adhesive surface, and the components are attached to the adhesive surface.

7. The component assembly system of claim 6, further comprising:
   a protective cover on the adhesive surface of the tape carrier, and wherein the assembly machine is adapted to peel the protective cover away from the tape carrier before attaching the components to the submounts on the submount carrier.

8. The component assembly system of claim 1, wherein the assembly machine is adapted to form an adhesive material between the submounts and the components.

9. The component assembly system of claim 8, wherein:
   the adhesive material is a glue, and the assembly machine is adapted to sufficiently cure the glue so that the components become more strongly attached to the submounts than to the tape carrier.

10. The component assembly system of claim 1, wherein:
    the assembly machine is adapted to form a solder material between the submounts and the components, and to at least partially melt the solder material so that the components attach to the submounts.

11. The component assembly system of claim 1, wherein the assembly machine is adapted to provide a thermocompression bond between the components and the submounts.

12. The component assembly system of claim 1, wherein each of the components is a light emitting diode die.

13. A method of assembling, comprising:
    providing a longitudinally elongated tape carrier;
    providing a plurality of components attached to the tape carrier;
    providing a longitudinally elongated submount carrier, the submount carrier including a plurality of connected submounts;
    moving the tape carrier longitudinally;
    moving the submount carrier longitudinally;
    sequentially aligning components on the tape carrier in close proximity to submounts on the submount carrier; and
    attaching the components to the submounts on the submount carrier.

14. The method of claim 13, further comprising detaching the tape carrier from the components, after the components are attached to the submounts on the submount carrier.

15. The method of claim 13, further comprising:
    forming a pattern of at least one longitudinal column of the components on the tape carrier;
    forming a pattern of at least one longitudinal column of the submounts on the submount carrier;
    aligning at least one component on the tape carrier with at least one submount on the submount carrier; and
    advancing the tape carrier and the submount carrier along longitudinal paths through a contact zone, at least one of the components contacting at least one of the submounts within the contact zone.

* * * * *